(12) United States Patent
Chuang et al.

(10) Patent No.: US 6,298,467 B1
(45) Date of Patent: Oct. 2, 2001

(54) METHOD AND SYSTEM FOR REDUCING HYSTERESIS EFFECT IN SOI CMOS CIRCUITS

(75) Inventors: Ching-Te K. Chuang, South Salem, NY (US); Mario M. Pelella, Gainesville, FL (US); Christophe R. Tretz, Riverdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/189,423

(22) Filed: Nov. 10, 1998

(51) Int. Cl.⁷ ..................................................... G06F 17/50
(52) U.S. Cl. ................................................................ 716/2
(58) Field of Search ............................... 257/347; 326/30; 716/2

(56) References Cited

U.S. PATENT DOCUMENTS 5,770,881 * 6/1998 Pelella et al. ........................ 257/347

* cited by examiner

Primary Examiner—Matthew Smith
Assistant Examiner—Thuan Do
(74) Attorney, Agent, or Firm—F. Chau & Associates, LLP

(57) ABSTRACT

A method for reducing a hysteresis effect in silicon-on-insulator CMOS circuits includes the steps of providing a circuit having CMOS objects, defining a beta ratio; resizing the CMOS objects based on the beta ratio, determining if the objects are a minimum size based on predetermined size criteria, if the objects are larger than the minimum size, defining a scaling factor based on a performance level of the object and resizing the object based on the scaling factor such that delay variations of the resized circuit are substantially constant. Also, a computer program product is provided for reducing the hysteresis effect.

19 Claims, 14 Drawing Sheets

US 6,298,467 B1

METHOD AND SYSTEM FOR REDUCING HYSTERESIS EFFECT IN SOI CMOS CIRCUITS

BACKGROUND OF THE INVENTION

1. Field of the Invention

The present invention relates to circuit design and, more particularly, to a system and method for reducing the undesirable effect of hysteresis (also called history effect) which degrades the performance of high performance circuits implemented using SOI CMOS processes.

2. Description of the Related Art

SOI (silicon-on-insulator) CMOS (complementary metal oxide semiconductor) devices/circuits have been demonstrated to operate faster than standard silicon bulk devices/circuits due to the improved current gain flowing through SOI devices. The faster operating speed is also due to the lack of parasitic junction capacitance, thus reducing the load being driven by the various gates/circuits implemented with SOI CMOS circuits. Typically, SOI circuits operate about 20 to about 35% faster than their bulk silicon counterparts.

There are however many effects related to SOI devices which may hinder the delay improvements claimed over bulk silicon devices. One such effect is the hysteresis effect, also called history effect. The hysteresis effect is caused by variations in the body potential ($V_B$) due to body-source leakage and impact ionization at the body-drain interface. (See FIG. 3). Impact ionization current increases the forward bias of the body voltage, which may lead to faster gate delays in dynamic equilibrium. In opposition to this, the relative magnitudes of forward and reverse bias currents reduce the forward bias over a sequence of transitions from equilibrium, resulting in slower gate delays. Both mechanisms (impact ionization and reduced forward bias currents) are competing against each other, resulting in slower or faster devices over time, depending on which mechanism dominates. A better understanding of hysteresis is illustrated in the FIGS. as described below.

The hysteresis effect results in a delay variation over time of the performance of circuits/gates. Referring to FIG. 1, an illustrative plot for delay versus time is shown for the delay variation for a similar circuit/gate implemented in both bulk and SOI. FIG. 1 shows the quantitative worst-case-best case delay variations in time and the relative magnitude of these variations for both a bulk and an SOI circuit. The top curve shows that there is no delay variation for the bulk circuit. The bottom curve shows that in the best case, SOI will start being 20 to 35% faster than bulk, and that in time, the SOI circuit might become faster due to the hysteresis effect by up to 40%, and then in time, might slow down again to be the same delay as at the beginning.

The hysteresis effect has a very significant impact on the timing and performance of circuits/gates implemented in an SOI CMOS process since there may be uncertainty in the actual timing of the various circuits/gates throughout the system. This uncertainty may vary at any given time since it depends on the past history of the various signals controlling these circuits/gates. Timing cannot be predicted, simulated or estimated using standard circuit/gate timing techniques since it would be too computationally intensive to perform a simple analysis. Considering circuit design and timing methodologies for high performance circuit design, such a large delay variation cannot be ignored. Delay variations may be as high as 40%. To capture the timing uncertainty, most timing tools will have a built-in margin for error. Since the nature and magnitude of the delay variation due to hysteresis is somewhat pattern dependent and is also dependent on the initial state of the circuit, high level timing tools cannot ensure that the initial timing will be the best or worst case timing. The timing tools will need an added margin on either side of the timing. Even when considering the least damaging initial condition in terms of delay variation (which would be to consider that we are averaging the effects causing hysteresis), it would still be necessary to add half the maximum delay variations to capture worst case design conditions.

Referring to FIG. 2, another illustrative plot for delay versus time is shown for the delay variation for a similar circuit/gate implemented in both bulk and SOI. Using the same notation as in FIG. 1, FIG. 2 shows the impact of timing margins added by timing tools if a default timing point was chosen as half way between the two extremes, which would lead to the smallest added timing margins on either side. FIG. 2 shows the impact of adding margin on either side of the timing. If the worst case delay variation is 40%, half of that is 20% which would basically use all the possible claimed advantage of SOI over bulk as shown in FIG. 2.

Adding enough timing margin at the system level to take into account the possible delay variation due to the hysteresis effect leads to a significant loss of performance for the overall system. For example, a system whose expected delay is T, or whose frequency is f=1/T, having a delay variation of 10%, leads to a loss of frequency of 10%. For high performance circuits, any loss due to an effect that cannot be controlled carefully is detrimental, especially considering that the delay variation due to the hysteresis effect may be as high as 40% (this means that a 1 GHz machine would only work at possibly 600 MHz).

Referring to FIG. 3, a cross-section of a partially-depleted SOI NMOS showing the various currents flowing through the devices is shown. $I_{CH}$ is a channel current, $I_{BJT}$ is a current created by the parasitic lateral bipolar device, $I_R$ is a recombination current, $I_{gi}$ is an impact ionization current and $I_{gt}$ is a thermal generation current. The definition of these currents is known in the art. A body potential $V_B$ at a silicon insulation layer ($SiO_2$). A source (S) having a potential $V_S$, a gate (G) having a potential $V_G$ and a drain (D) having a potential $V_D$ are shown. A potential difference between source and body is indicated as $V_{BS}=V_B-V_S$. FIG. 4 shows a rough representation of the I-V curves for such a SOI device shown in FIG. 3 showing the different regions of operation of the SOI device.

Referring to FIG. 5, a standard CMOS inverter formed by SOI NMOS devices similar to those shown in FIG. 3 as well as by SOI PMOS devices is provided. NMOS devices have a width Wn, and PMOS devices have for width Wp. In FIG. 6 a more generic representation of a CMOS gate implemented with a pull up switch Sp controlled by pullup control signals, and a pulldown switch Sn controlled by pulldown control signals is shown. The switches Sp and Sn are made of a network of PMOS and NMOS devices respectively. Both the inverter and the generic gate are shown driving an output load CL, which in turn is representing another generic gate.

Relevant waveforms are shown in FIGS. 7A–D illustrating the hysteresis effect on the gate shown in FIGS. 5 and 6. FIG. 7 shows the hysteresis phenomenon through four waveforms relevant to events in time occurring in the inverter/gate of FIGS. 5 and 6. FIG. 7A represents an input waveform Input(V). FIG. 7B represents an output waveform Output(V). FIG. 7C is a third waveform showing the variation of the body potential in the NMOS (in fact it is the body to source voltage $V_{BS}$ which is shown since it is more significant than the body potential, and is directly related to the threshold voltage of the device). FIG. 7D is a fourth waveform showing the body to source voltage $V_{BS}$ for the PMOS device.

FIG. 8 summarizes an average delay over time and further illustrates the variations of average delay defined as the half sum of the rise and fall delay (50% point) as described for FIG. 2 through the inverter/gate of FIGS. 5 and 6. FIGS. 9 and 10 are summarize the curve of FIG. 8 and show the variations in body to source voltage for the NMOS (NFET) and PMOS (PFET) devices, respectively, for both the fall and rise transitions.

There are presently no alternate techniques aiming at reducing the impact of the hysteresis effect in SOI CMOS circuit other than increasing timing constraint to take into account possible worst case delay variations as described above. Such a technique while efficient in terms of avoiding the delay variation due to the hysteresis effect, has the very undesirable effect of reducing the system frequency by the same amount the timing margins were increased.

"Remapping" (a direct reprocessing on an SOI fabrication line of existing designs supposed to be fabricated in bulk silicon) is often presented as a very attractive solution since it appears that circuits directly remapped will exhibit the highest delay variations due to hysteresis, standard and proposed design techniques for SOI technologies might lead to significant failures.

Therefore, a need exists for a system and method for circuit design of SOI CMOS circuits/devices which results in reducing the hysteresis effect.

SUMMARY OF THE INVENTION

A method for reducing a hysteresis effect in silicon-on-insulator CMOS circuits, in accordance with the present invention, includes the steps of providing a circuit having CMOS objects included therein, defining a beta ratio based on CMOS object widths and resizing the CMOS objects based on the beta ratio such that delay variations of the resized circuit are substantially constant.

Another method for reducing a hysteresis effect in silicon-on-insulator CMOS circuits includes the steps of providing a circuit having CMOS objects, defining a beta ratio; resizing the CMOS objects based on the beta ratio, determining if the objects are a minimum size based on predetermined size criteria, if the objects are larger than the minimum size, defining a scaling factor based on a performance level of the object and resizing the object based on the scaling factor such that delay variations of the resized circuit are substantially constant.

In alternate methods, the step of defining the beta ratio may include the step of calculating the beta ratio by dividing a pullup width by a pulldown width for the CMOS objects. The step of providing the circuit may include the steps of providing a bulk silicon CMOS circuit and remapping the bulk silicon CMOS circuit to provide a silicon-on-insulator CMOS circuit. The step of providing the circuit may include the step of providing a specific silicon-on-insulator CMOS circuit. The step of resizing may include the step of reducing gate sizes of the objects thereby reducing capacitive loads and increasing circuit speed. The step of defining the beta ratio may include the step of defining a default beta ratio for the circuit having CMOS objects. The objects preferably include one of gates, devices and circuits.

In still other methods, the step of determining if the objects are a minimum size based on predetermined size criteria may include the step of determining if the objects are a minimum size based on the beta ratio. The step of defining a scaling factor based on a performance level of the object may include the step of defining a scaling factor based on a current ratio, the current ratio being calculated as the ratio between a first current needed to drive a load, and a second current needed to drive the same load after an object to drive the load is resized.

A computer program product includes a computer usable medium having computer readable program code embodied therein for sizing silicon-on-insulator CMOS circuits for reducing a hysteresis effect, the computer readable program code in the computer program product including computer readable program code for causing a computer to represent a circuit having CMOS objects, computer readable program code for causing a computer to define a beta ratio, computer readable program code for causing a computer to resize the CMOS objects based on the beta ratio, computer readable program code for causing a computer to determine if the objects are a minimum size based on predetermined size criteria, computer readable program code for causing a computer to define a scaling factor based on a performance level of the object, if the objects are larger than the minimum size and computer readable program code for causing a computer to resize the object based on the scaling factor such that delay variations of the resized circuit are substantially constant.

In alternate embodiments, the program code for causing the computer to define the beta ratio may include program code for calculating the beta ratio by dividing a pullup width by a pulldown width for the CMOS objects. The program code for causing the computer to represent a circuit having CMOS objects may include program code for representing a bulk silicon CMOS circuit and for remapping the bulk silicon CMOS circuit to provide a silicon-on-insulator CMOS circuit. The program code for causing the computer to represent a circuit having CMOS objects may include program code for providing a specific silicon-on-insulator CMOS circuit. The program code for causing the computer to resize the CMOS objects based on the beta ratio may include program code for reducing gate sizes of the objects thereby reducing capacitive loads and increasing circuit speed. The program code for causing the computer to define the beta ratio may include program code for defining a default beta ratio for the circuit having CMOS objects. The objects preferably include one of gates, devices and circuits. The program code for causing the computer to determine if the objects are a minimum size based on predetermined size criteria may include program code for determining if the objects are a minimum size based on the beta ratio. The program code for causing the computer to define a scaling factor based on a performance level of the object may include program code for defining a scaling factor based on a current ratio, the current ratio being calculated as the ratio between a first current needed to drive a load, and a second current needed to drive the same load after an object to drive the load is resized.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to circuit design and, more particularly, to a system and method for reducing the undesirable effect of hysteresis (also called history effect) which degrades the performance of high performance circuits implemented using SOI CMOS processes. The present invention implements design, topologies and devices and their properties to circumvent the hysteresis effect. This leads to an increase in performance.

The present invention defines a beta ratio to resize devices and gates, and further defines a scaling factor which is based on current gain. The present invention takes advantage of properties of PMOS and NMOS devices to adjust slew and further adjusts output loads to improve speed of the devices and gates. The present invention reduces most of the delay variation resulting from the hysteresis effect, and will simultaneously further enhance the performance improvements related to SOI by significant amounts. The present invention provides high performance design using SOI CMOS and takes advantage of the speed improvement offered by this technology without being hindered by the hysteresis effect. The invention reduces significantly the impact of hysteresis on circuit performance and further improves the performance of the design by, for example, reducing load capacitance resulting from small sizes of the designed gates.

Figure 11:
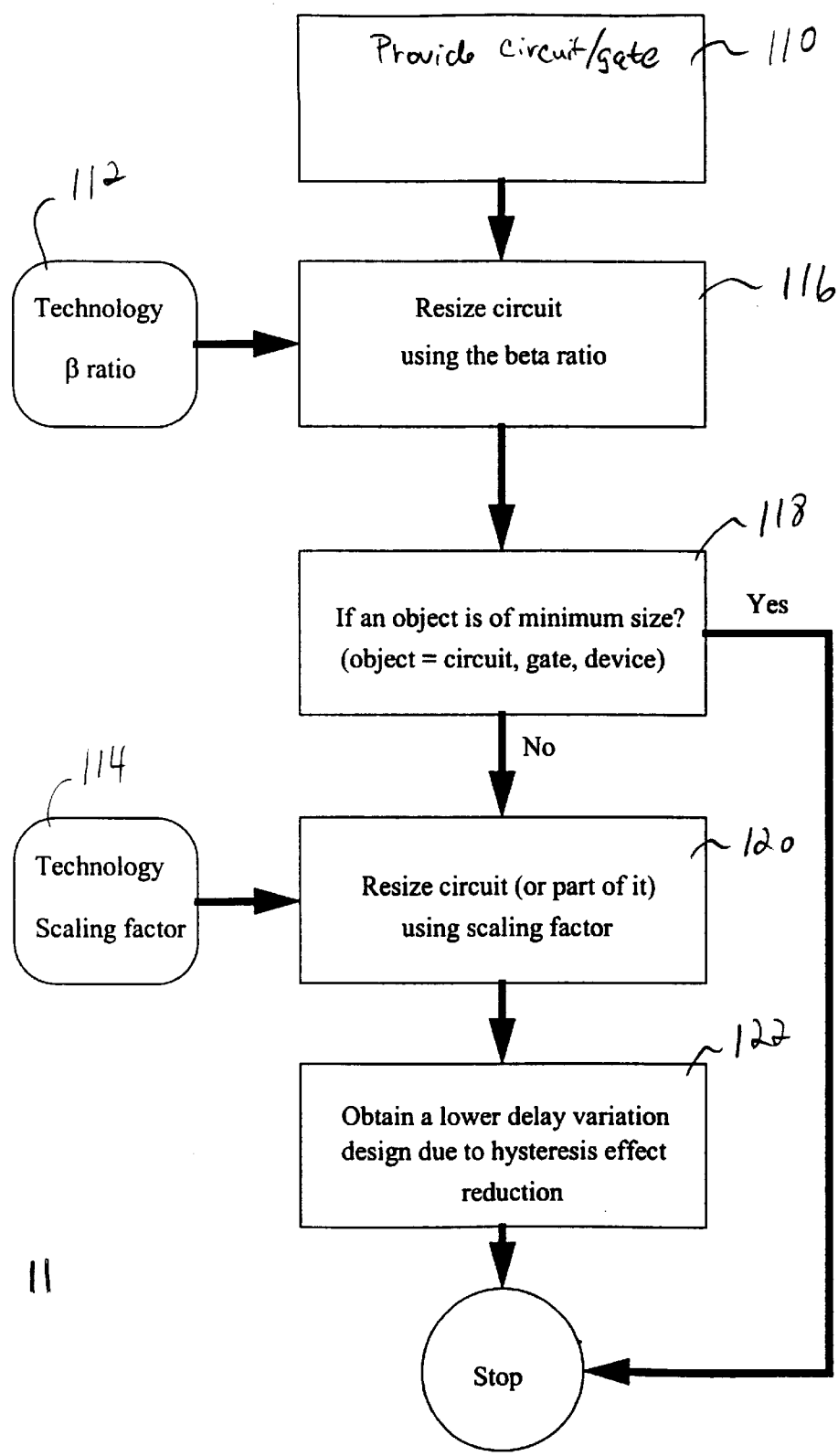
FIG. 11 is a block/flow diagram showing a computer based system and method in accordance with the present invention.

It should be understood that the elements shown in FIG. 11 may be implemented in various forms of hardware, software or combinations thereof. Preferably, these elements are implemented in software on one or more appropriately programmed general purpose digital computers having a processor and memory and input/output interfaces. Referring now to the drawings in which like numerals represent the same or similar elements and initially to FIG. 11, a flow/block diagram is shown for a method/system in accordance with the present invention. In block 110, a circuit/device to be modified or designed in accordance with the present invention is provided. Two different starting points may be used, these starting points represent two approaches to designing with an SOI CMOS process. In a first approach, an equivalent bulk design is used as a starting point, directly remapped to the SOI CMOS process. In a second approach, an SOI specific design already having SOI specific characteristics such as different gate topologies is used. In the second approach, the final delay improvement may not be as significant as in the first approach since a designer may have already used some other techniques specific to SOI for delay improvement.

For each generation, two external steps are performed to provide two technology dependent parameters for the present invention. In block 112, a beta ratio β is defined for a given technology. The process to obtain this ratio is known in the art and may be difficult to obtain if accuracy is required. The beta ratio is defined in greater detail herein below.

In block 114, a scaling factor is defined for representing an amount a device size may be reduced while keeping the same desired device drive/current. This may be achieved in several different ways, two of which are described here and are known to those skilled in the art. One approach is to obtain the current for the same load and use the current ratio as the scaling factor. This approach is straight forward, but lacks accuracy and may not reflect many other effects related to the size modifications. A second approach considers that by reducing the size of the devices in the driving gate/circuit, a similar amount of the load driven by this circuit/gate is reduced. Since this load includes the circuit/gate, a further scale down of the size of the device may be provided if it is desired to maintain the same performance level, or the same size. This may result in an increased drive, and as a consequence, increased performance.

After defining the two technology dependent parameters, beta ratio and scaling factor, the given circuit/gate/device (hereinafter called an object) of block 110 is resized in block 116 by applying the derived beta ratio β. This may be performed in many different ways. In a preferred embodiment, an automation of this technique can be achieved by, for example, using a tool such as the one disclosed in commonly assigned Ser. No. 09/046,826 which is incorporated herein by reference.

In block 118, the objects are checked to determine if the objects are already at minimum size (when taking into account the beta ratio). Minimum size is determined in accordance with the beta ratio that is if the beta ratio is achieved for the object during resizing in block 116 than the method is ended. Otherwise, the method path is directed to block 120.

In block 120, the size of the object is scaled down to a minimum acceptable size while maintaining acceptable current/drive characteristics, and while maintaining the specified timing constraints. Minimum acceptable sizes are design specific and rely on criteria and specifications for a particular design need. Block 120 is implemented in some cases to be able to meet timing constraints since this step has the highly desirable effect of maintaining or improving timing through the object.

In block 122, the resulting object is less subject to the impact of the hysteresis effect, and also exhibits improved performance/delay. The present invention is used to regain up to about 30% in performance in SOI CMOS circuits/gates. Block 122 further includes other techniques for improving performance, such as, reducing capacitance load during resizing as will be described hereinbelow.

Beta Ratio and Impact on Hysteresis

Referring again to FIGS. 5 and 6, in an SOI CMOS process, PMOS devices are relatively faster than NMOS devices when compared with the PMOS and NMOS devices in an equivalent bulk silicon CMOS process. The beta ratio is defined as the ratio between the width of the PMOS device to the width of the NMOS device in a CMOS inverter. It is widely accepted in the industry that to achieve a high performance design, it is desirable to size gates such that the rise and fall transitions at the output of the gates are equal (or at least of similar magnitude). Since the PMOS device is faster with respect to the NMOS device in SOI CMOS processes when compared to bulk designs, the beta ratio needed to achieve equal rise and fall times in an SOI CMOS process tends to be smaller and closer to unity than it would be for an equivalent bulk CMOS process.

Figure 12:
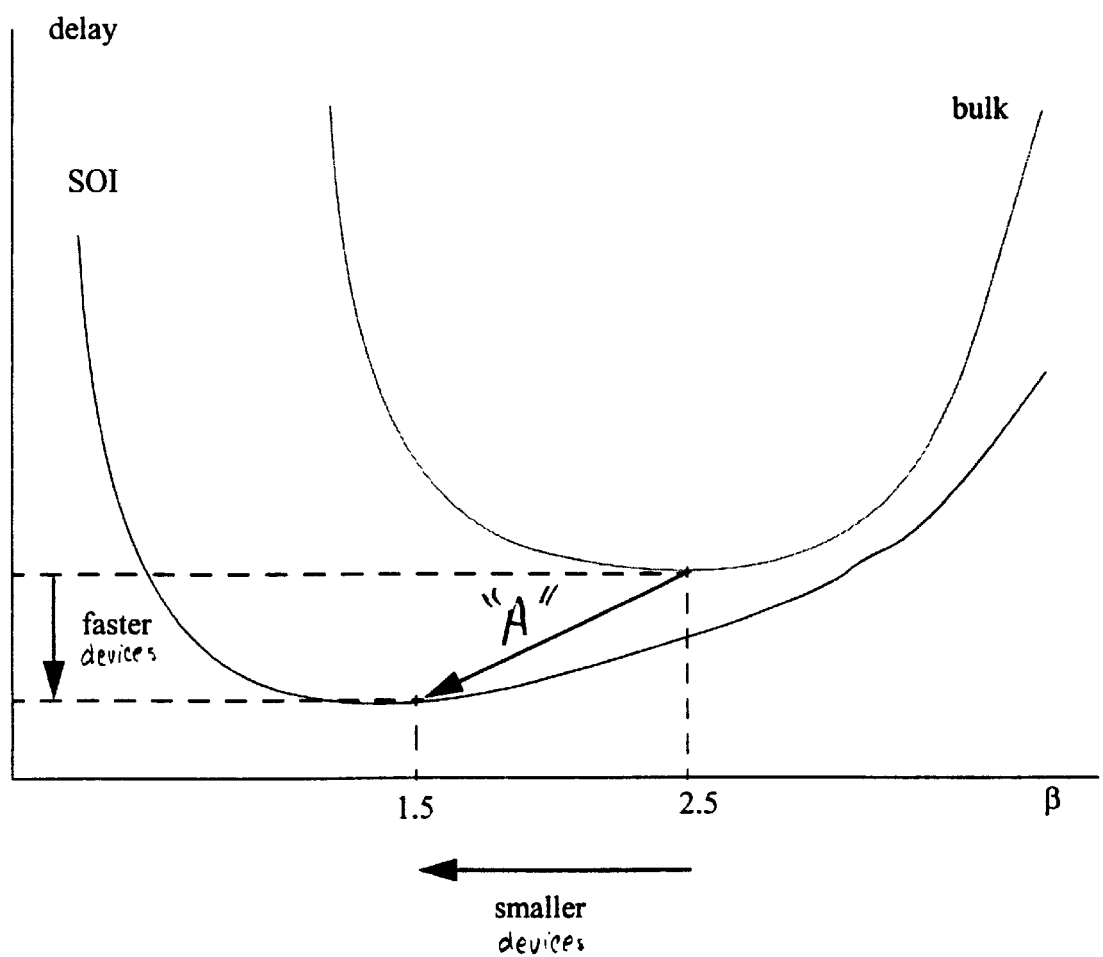
FIG. 12 is a plot of delay versus beta ratio showing a shift in the beta ratio to achieve equivalent rising and falling transition between for a bulk silicon and a SOI process.

Referring to FIG. 12, a shift (indicated by arrow "A") in beta ratio between a circuit/gate implemented in a bulk process versus the same circuit implemented in an SOI process is shown. The shift in the beta ratio is to achieve equivalent rising and falling transitions between a bulk process and an SOI process. Not only is SOI faster overall, bulk curve is always above the SOI curve, but also, the lowest point of the SOI curve is shifted to the left with respect to the lowest point of the bulk curve, denoting a lower ratio between the size of the PMOS devices with respect to the size of the NMOS devices. FIG. 12 illustrates the consequences of the statement that the SOI CMOS process tends to be smaller and closer to unity than it would be for an equivalent bulk CMOS process. Since a faster PMOS device results in a smaller PMOS device, to match the speed of the faster NMOS device, the PMOS device needs to be smaller resulting in a smaller ratio between the two device widths to achieve equal rise and fall transition times.

Figure 14:
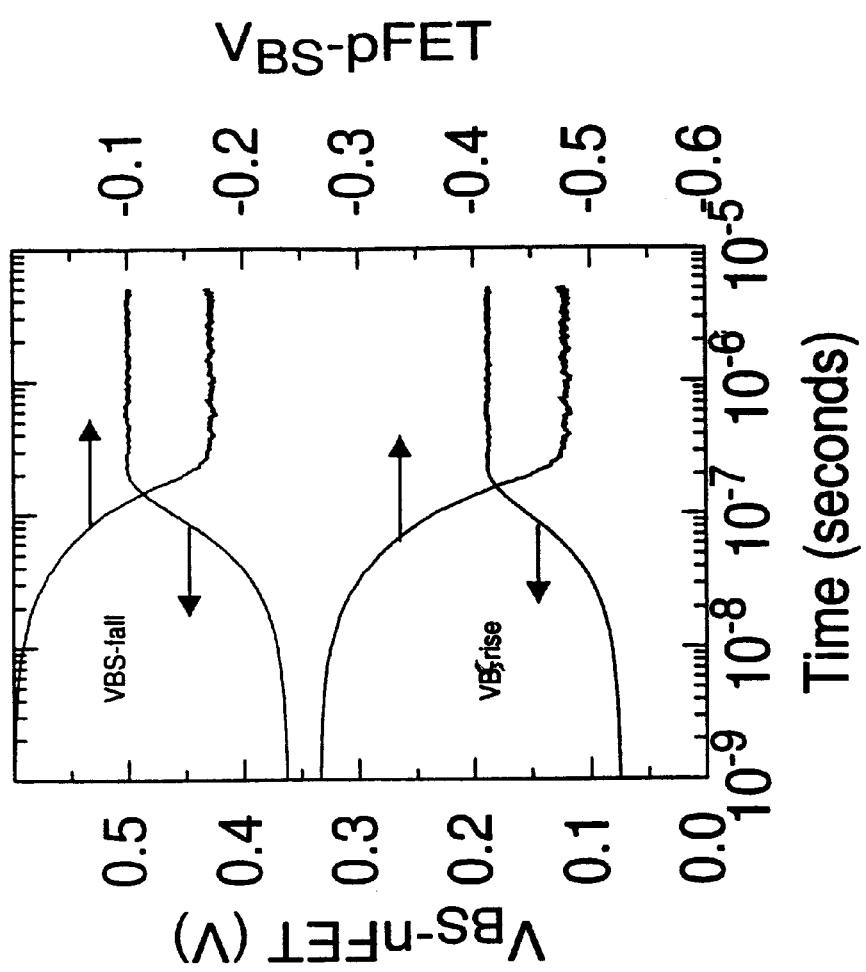
FIG. 14 is a plot of body to source voltage ($V_{BS}$) versus time for a PFET and an NFET device for a beta ratio of 2.
Figure 13:
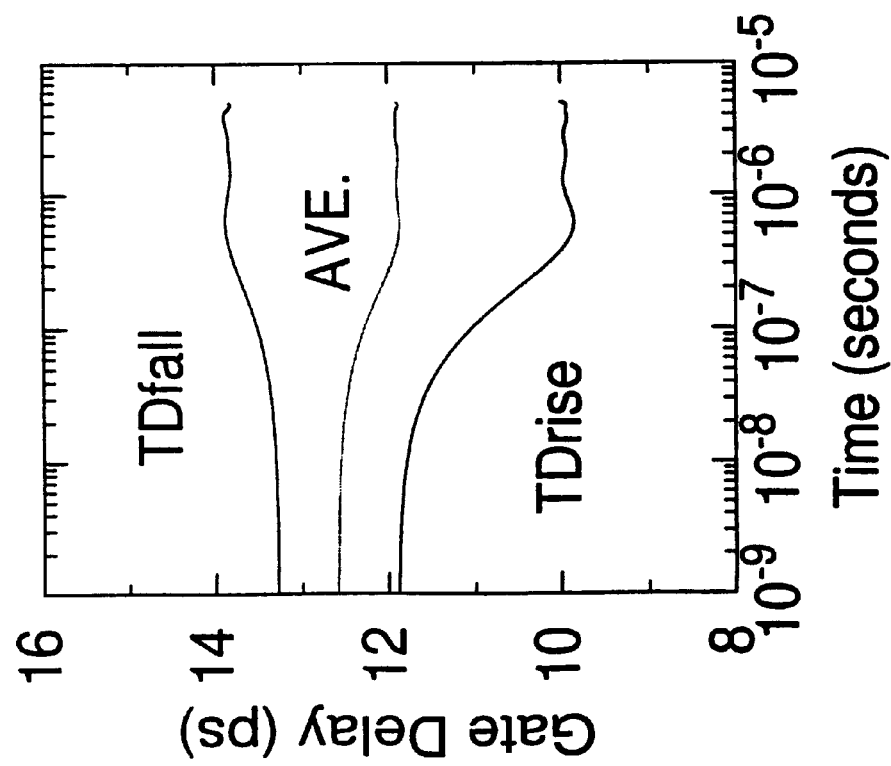
FIG. 13 is plot of gate delay versus time showing delay variations for a beta ratio of 2.
Figures 15, 16:
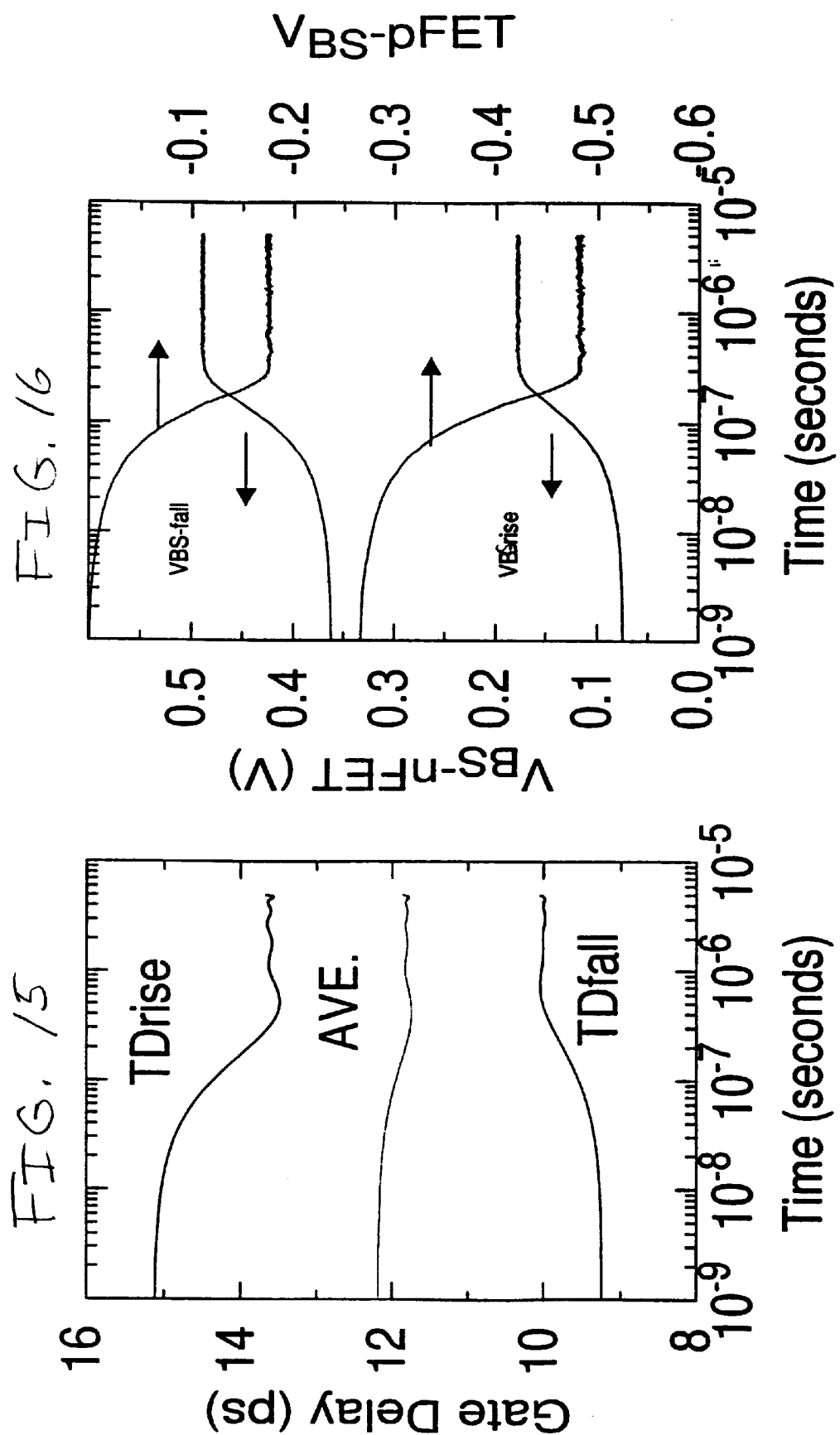
FIG. 15 is plot of gate delay versus time showing delay variations for a beta ratio of 1.5.
FIG. 16 is a plot of body to source voltage ($V_{BS}$) versus time for a PFET and an NFET device for a beta ratio of 1.5.
Figure 18:
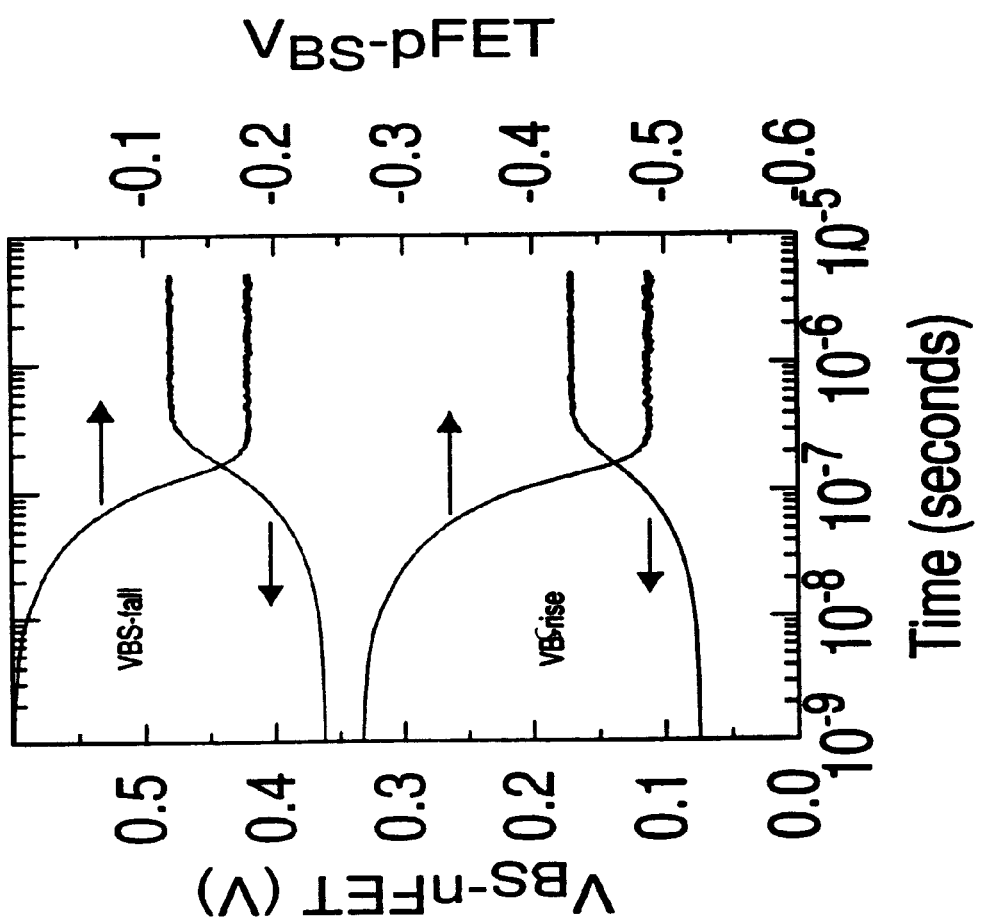
FIG. 18 is a plot of body to source voltage ($V_{BS}$) versus time for a PFET and an NFET device for a beta ratio of 1.
Figure 17:
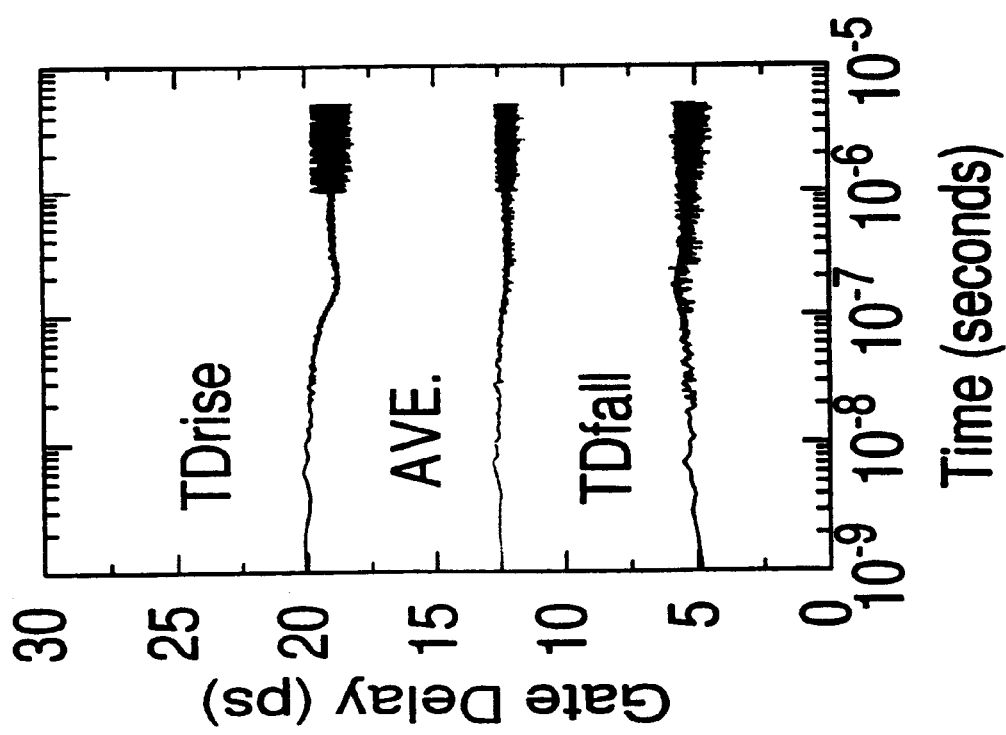
FIG. 17 is plot of gate delay versus time showing delay variations for a beta ratio of 1.

Applying the principle of beta ratio reduction to see the impact on the hysteresis, several different beta ratios were applied to the same circuit, and the results are illustratively shown in FIGS. 13–18. FIGS. 13 and 14 represent gate delay and $V_{BS}$ (for both NMOS and PMOS transistors in inverter/gate circuits of FIGS. 5 and 6) versus time, respectively for a beta ratio of 2. FIGS. 15 and 16 represent gate delay and $V_{BS}$ (for both NMOS and PMOS transistors in inverter/gate circuits of FIGS. 5 and 6) versus time, respectively for a beta ratio of 1.5. FIGS. 17 and 18 represent gate delay and $V_{BS}$ (for both NMOS and PMOS transistors in inverter/gate circuits of FIGS. 5 and 6) versus time, respectively for a beta ratio of 1. FIGS. 13–18 had data collected under the following conditions $V_{dd}$=1.8 V, $L_{eff}$=0.145 mm, temperature=27° C., CL=10 fF, 50% duty cycle, 1 ns period (1 GHz).

FIGS. 13, 15 and 17 show the changes in delay variations for different beta ratios, clearly showing that a smaller beta ratio strongly reduces the amount of hysteresis. FIG. 13 shows the delay variation for a ratio of 2, FIG. 15 for a ratio of 1.5 and FIG. 17 shows beta for a ratio of 1. The circuit used to obtain these curves is the inverter/gate shown in FIGS. 5 and 6. A beta ratio of 2 leads to a delay variations of about 6%, a beta ratio of 1.5 leads to a delay variation of about 4%, and a beta ratio of 1 leads to a delay variation of about 2%.

Significant reductions in the delay variations can be achieved by reducing the beta ratio, even past the point for which equal rise and fall times are achieved while keeping the same overall delay, denoting the very flat behavior of the curves for SOI gates past the point for equal transition times (crossing points of $V_{BS}$ curves for NMOS (NFET) and PMOS (PFET) in FIGS. 14, 16 and 18). As indicated in the FIGS., TD represents time delay in TDfall and TDrise represent time delay for a falling transition and time delay for a rising transition, respectively.

Current Scaling and Load Scaling

Delay, power, slews (transition times) are all a function of a driven load by a gate/circuit, and of the respective strength of the driving circuit/gate/device. Delay is in fact proportional to the driven load capacitance $$\text{delay } C_{load} \tag{EQ. 1}$$

When considering highly packed circuits, the driven capacitive load is a representation of the capacitance associated with the gates (or source/drain) of the devices connected to an output network driven by the considered gate/circuit. Referring again to FIGS. 5 and 6, the beta ratio β is defined as the ratio between the pullup width and the pulldown width of the devices used to implement the gate (as a note, this definition is used for an inverter, but every complex gate/circuit can be modeled as an inverter):

$$\beta = W_p/W_n \tag{EQ. 2}$$

If we now compare the loads for an SOI and a bulk design:

$$C_{load,SOI} (1+\beta_{SOI})W_n \tag{EQ. 3}$$

$$C_{load,bulk} (1+\beta_{bulk})W_n$$

and the ratio of the respective delay:

$$\text{delay}_{SOI}/\text{delay}_{bulk} = (1+\beta_{SOI})/(1+\beta_{bulk}) \tag{EQ. 4}$$

In a typical SOI process, the beta ratio could be on the order of 1.5, while in a typical bulk process, the beta ratio will be more on the order of 2.5. Using the values in the previous equation, a delay improvement may be implemented on the order of 30% only due to a reduction of the driven load capacitance. This extra gain will be used in the method of the present invention to further reduce the impact of hysteresis effect in SOI CMOS circuit/gates. Also, power reduction is achieved for a reduction of about 33% when, for example, beta is reduced from 2 to 1.

A smaller load capacitance can be represented in many different ways, but one of the most efficient is using different slews (or transition times). A smaller driven load leads to faster transition times (and respectively, a larger load leads to slower transition times).

Figure 20:
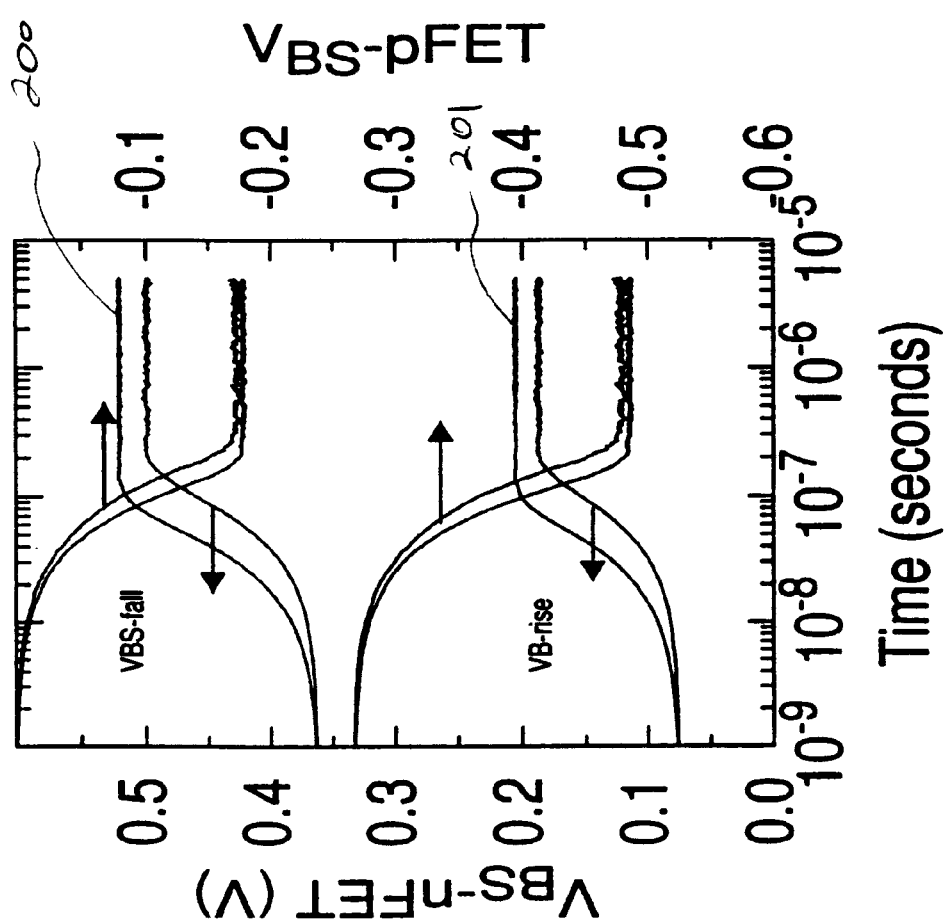
FIG. 20 is a plot of body to source voltage ($V_{BS}$) versus time for a PFET and an NFET device for the two slews of FIG. 19.
Figure 19:
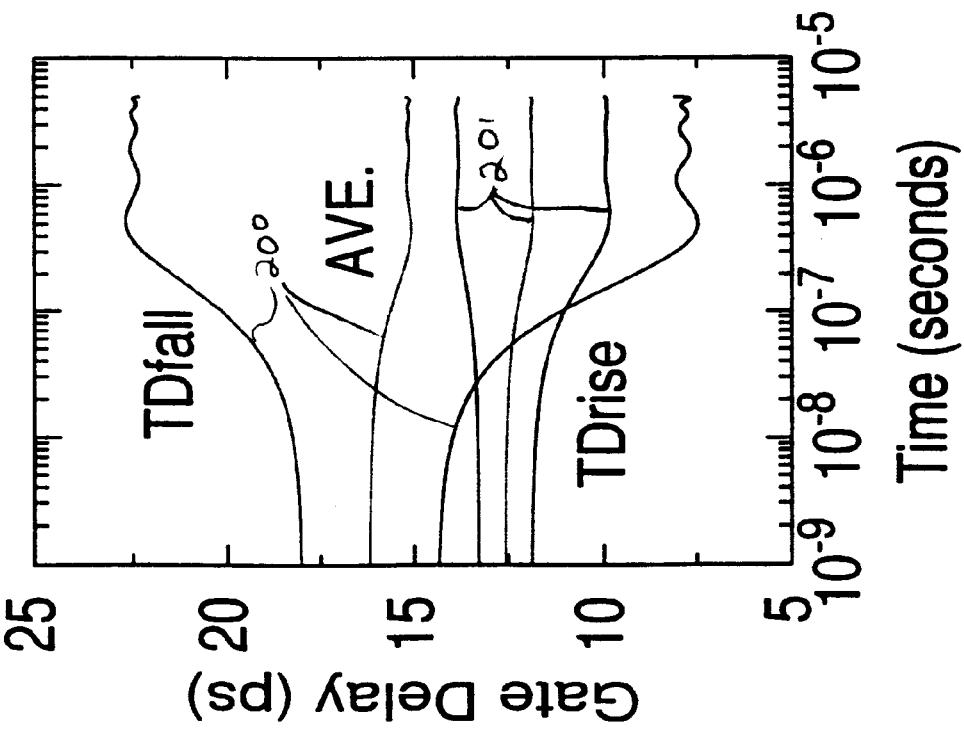
FIG. 19 is a plot of gate delay versus time showing delay variations for 100 ps and 400 ps slews.

Referring to FIGS. 19 and 20, the changes in delay variations for different slews and $V_{BS}$ both versus time are respectively shown. Two somewhat extreme cases are shown in FIG. 19 to illustrate this point. Top curves 200 show the delay variation for a transition time of 100 ps, and bottom curves 201 show the delay variation for a transition time of 400 ps. The delay variation for the fast transition (smaller load) is of 6%, and the delay variation for the slow transition (larger load) is of 10%. A difference in delay variation for different slews (transition times) is shown, clearly indicating the impact of having faster transition times, or smaller loads. This indicates that it is highly desirable to have smaller devices/gates/circuits. FIGS. 19–20 had data collected under the following conditions $\beta=2$, $V_{dd}=1.8$ V, $L_{eff}=0.145$ mm, temperature=27° C., CL=10 fF, 50% duty cycle, 1 ns period (1 GHz) and 100 to 400 ps Tr/Tf slew (Tr/Tf is the ratio of rising transition time/delay and falling transition time/delay). A slower slew (larger transition time) is a consequence of a load too large to be driven by the considered gate/driver. A smaller load, i.e., a smaller gate and/or smaller devices, will help in reducing the slew, hence reducing at the same time the impact of hysteresis on delay. FIGS. 19–20 show that with a slower slew (400 ps), the delay variation due to hysteresis is larger than with a faster slew (100 ps). The slew being a direct consequence of the load/size of the gate being driven. Therefore, faster/smaller gates are better at reducing hysteresis.

Figure 1:
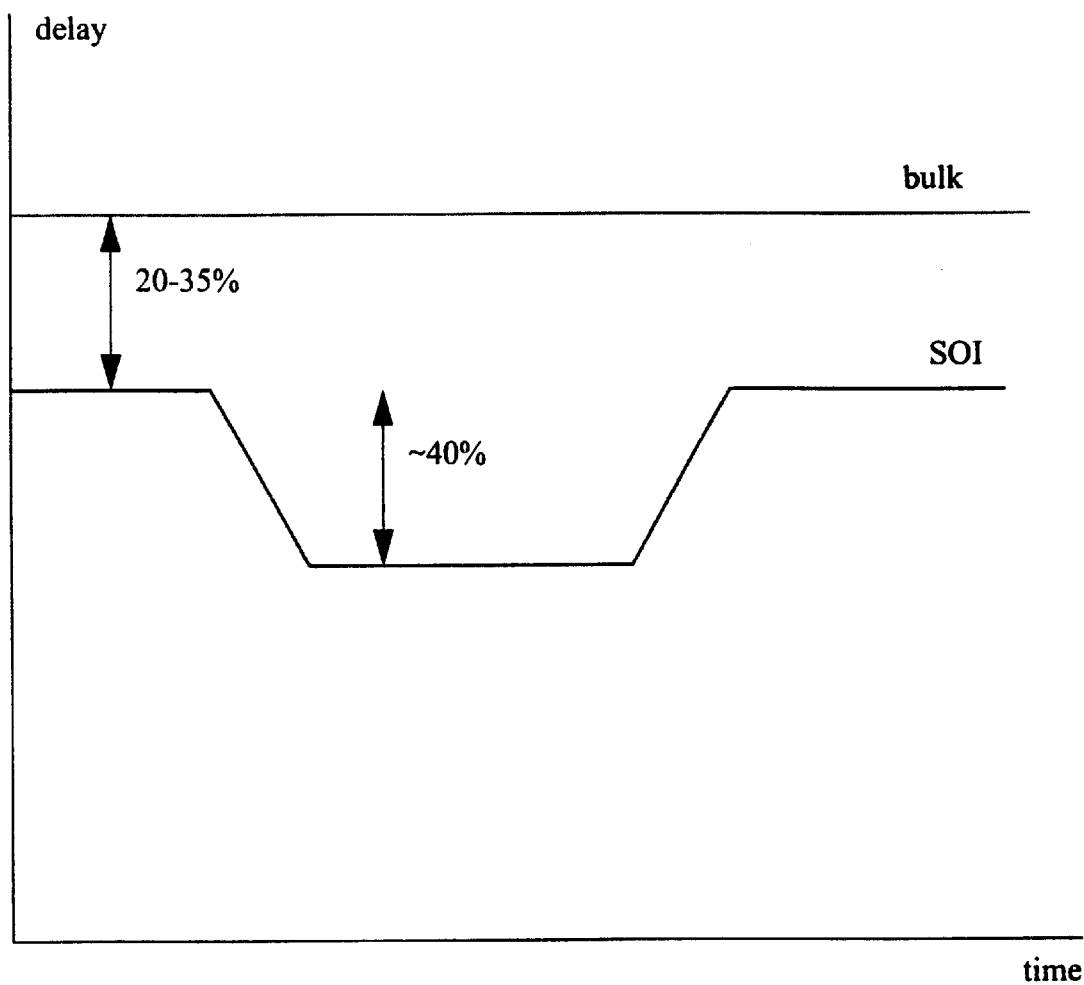
FIG. 1 is a plot of delay versus time showing delay variations for bulk silicon and SOI circuits in accordance with the prior art.
Figure 2:
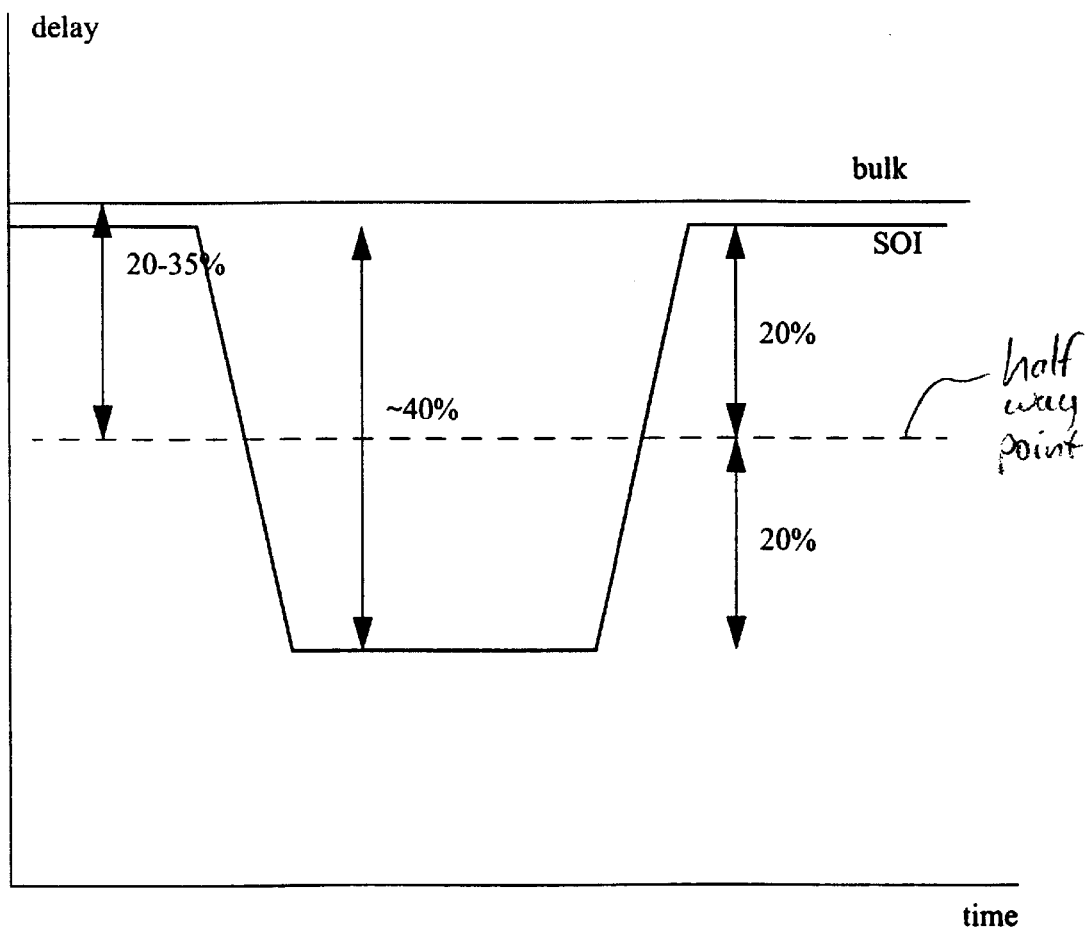
FIG. 2 is a plot of delay versus time showing timing margins added for timing tools if a default timing point is chosen half way between extremes of the SOI delay variations in accordance with the prior art.
Figure 3:
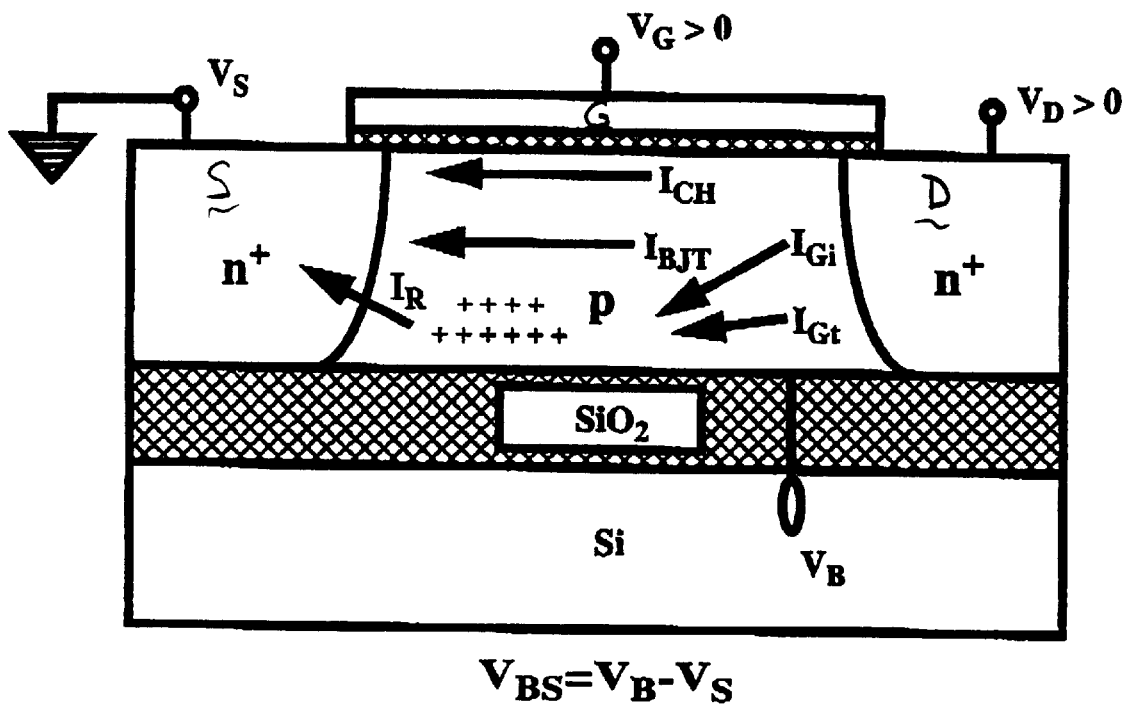
FIG. 3 is a cross-sectional view of a partially depleted SOI transistor device showing current flow therethrough in accordance with the prior art.
Figure 4:
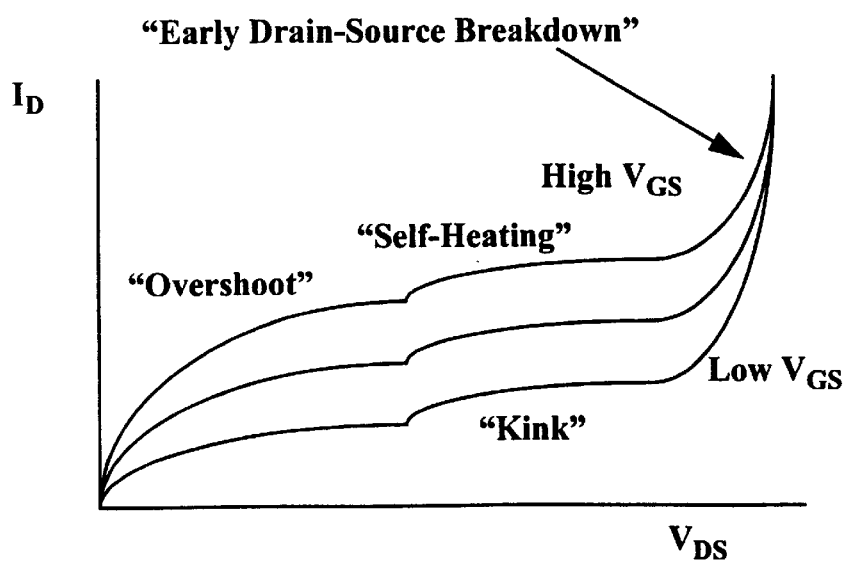
FIG. 4 is a plot of current-voltage curves (I-V curves for the SOI transistor device of FIG. 3 in accordance with the prior art.
Figure 5:
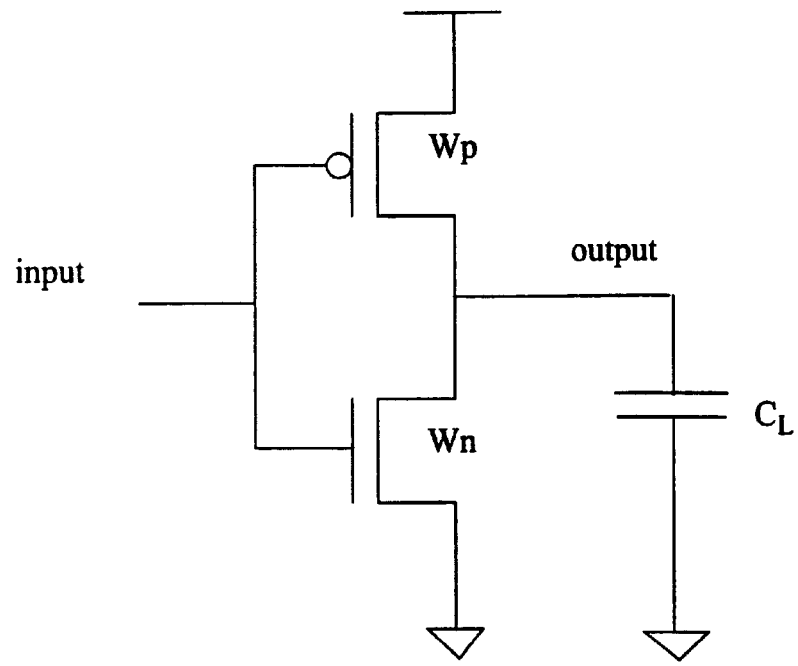
FIG. 5 is a schematic diagram of an inverter circuit showing an NMOS transistor, a PMOS transistor and a load capacitance.
Figure 6:
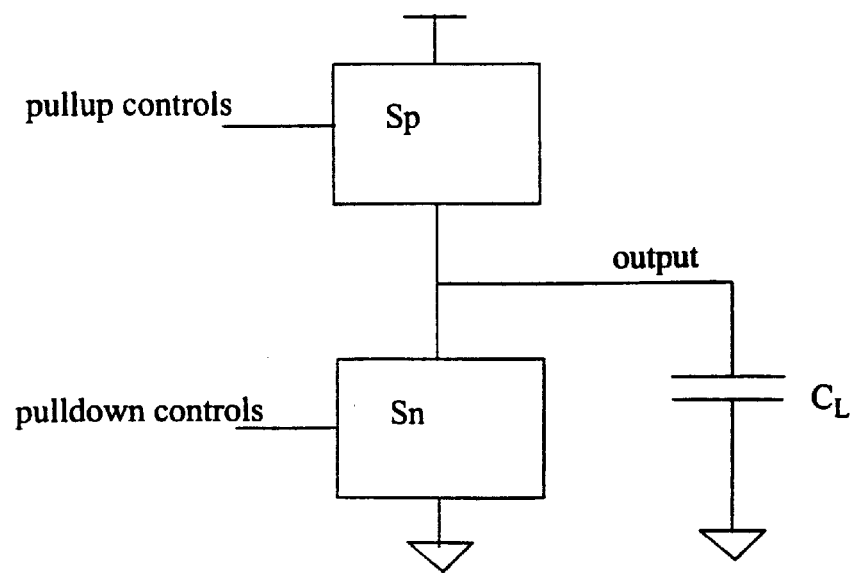
FIG. 6 is a schematic diagram of a generic gate circuit showing a pulldown switch, a pullup switch and a load capacitance.
Figure 7A:
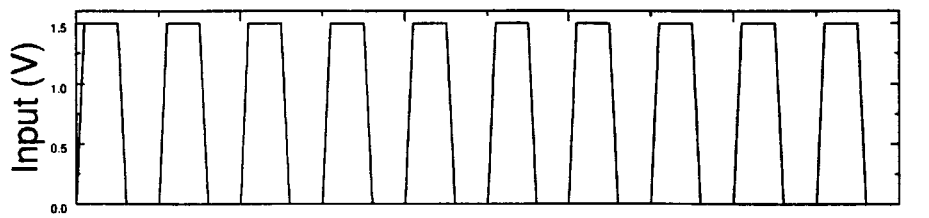
FIGS. 7A–D are waveforms showing the result of the hysteresis effect in accordance with the prior art.
Figure 7B:
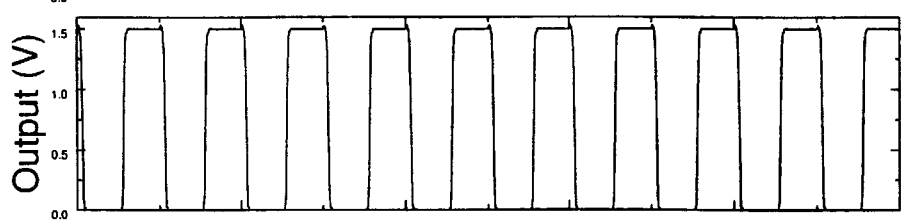
Figure 7C:
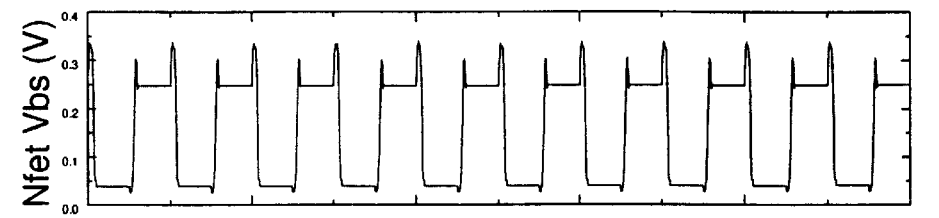
Figure 7D:
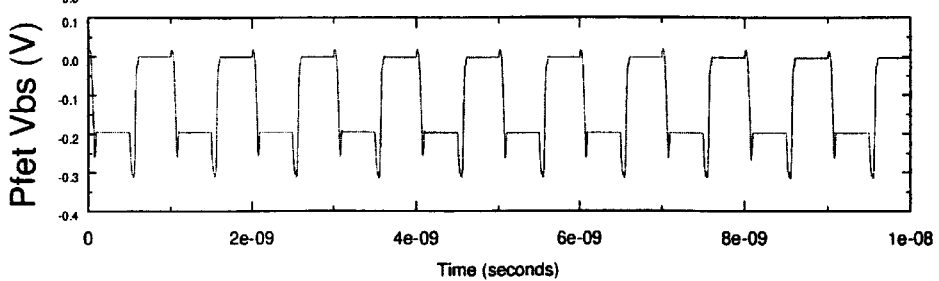
Figure 8:
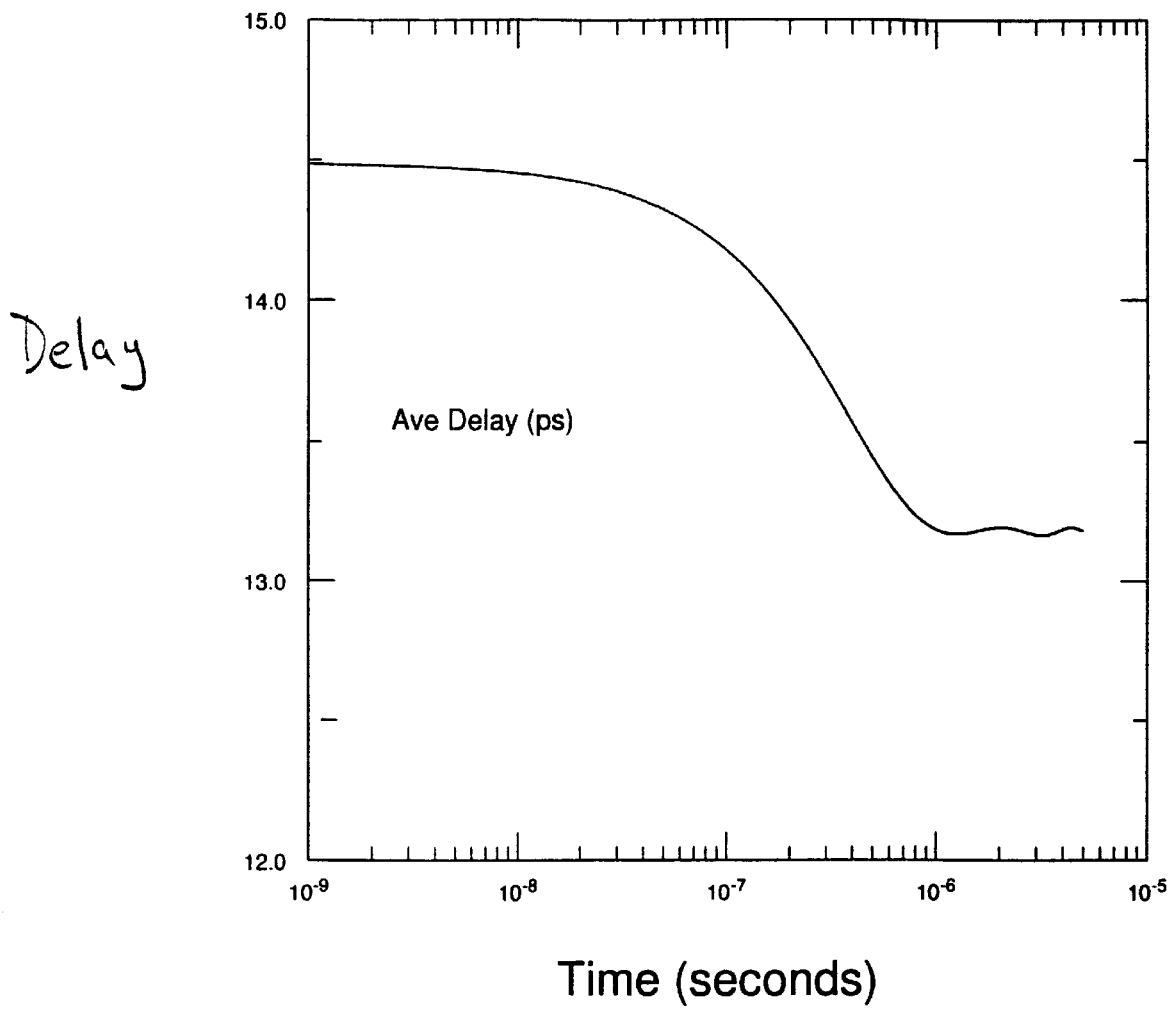
FIG. 8 is a delay versus time plot showing average delay variations (half sum of the rise and fall delays) through the inverter of FIG. 5.
Figure 9:
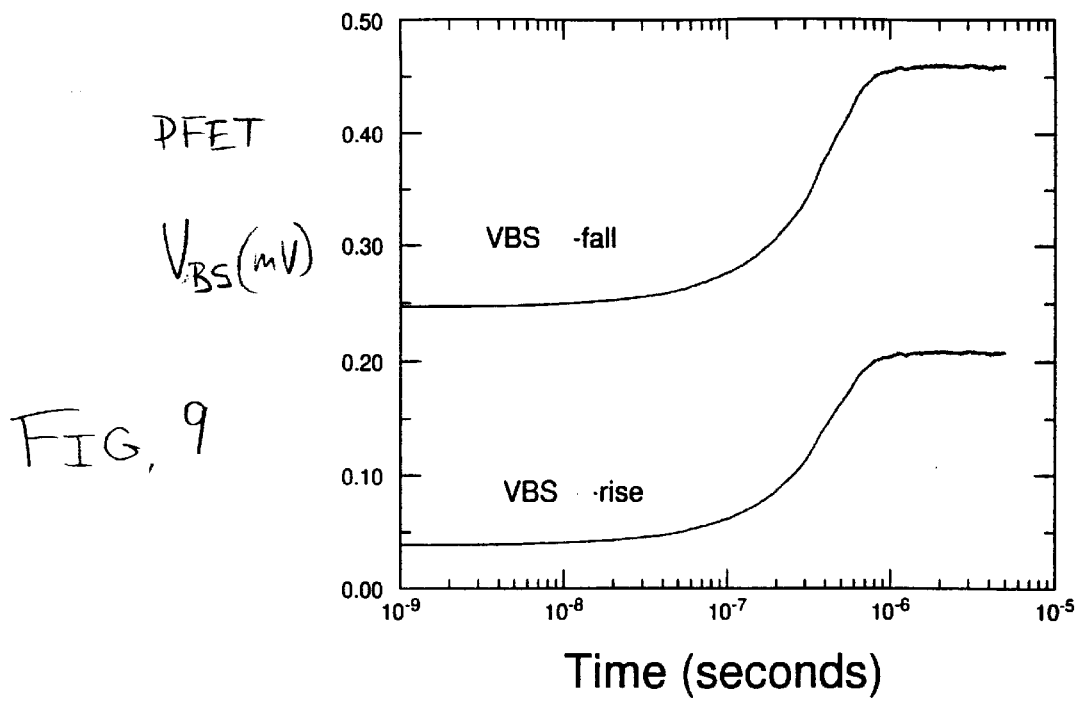
FIGS. 9 and 10 are body to source voltage ($V_{BS}$) versus time plots showing variations in $V_{BS}$ for NMOS and PMOS devices respectively for both rise and fall transitions for the inverter of FIG. 5.
Figure 10:
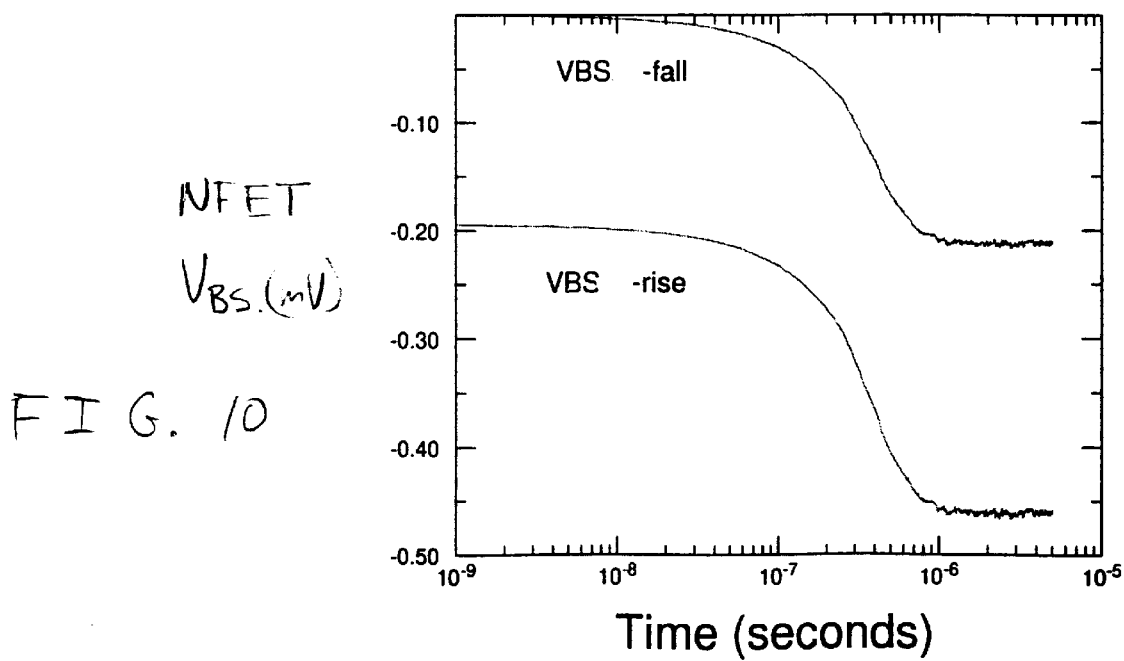

Another feature of the present method is that since SOI is typically faster than bulk due to an increased current gain. A further scale down of the size of the devices inside switches, (for example, pullup switches and pulldown switches as shown in FIG. 5), while keeping the same expected drive as the one obtained for bulk may be achieved.

Having described preferred embodiments of a method and system for reducing hysteresis effect in SOI CMOS circuits (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for reducing a hysteresis effect in silicon-on-insulator CMOS circuits comprising the steps of:
providing a circuit having CMOS objects included therein by providing a bulk silicon CMOS circuit and remapping the bulk silicon CMOS circuit to provide a silicon-on-insulator CMOS circuit;
defining a beta ratio based on CMOS object widths so as to reduce the beta ratio while maintaining performance for the CMOS objects above a threshold performance; and
resizing the CMOS objects based on the beta ratio such that delay variations of the resized circuit are substantially constant over time.

2. The method as recited in claim 1, wherein the step of defining the beta ratio includes the step of calculating the beta ratio by dividing a pullup width by a pulldown width for the CMOS objects.

3. The method as recited in claim 1, wherein the step of resizing includes the step of reducing gate sizes of the objects thereby reducing capacitive loads and increasing circuit speed.

4. The method as recited in claim 1, wherein the step of defining the beta ratio includes the step of defining a default beta ratio for the circuit having CMOS objects.

5. The method as recited in claim 1, wherein the objects include one of gates, devices and circuits.

6. A method for reducing a hysteresis effect in silicon-on-insulator CMOS circuits comprising the steps of:
providing a circuit having CMOS objects by providing a bulk silicon CMOS circuit and remapping the bulk silicon CMOS circuit to provide a silicon-on-insulator CMOS circuit;
reducing a beta ratio while maintaining performance for the CMOS objects above a threshold performance;
resizing the CMOS objects based on the beta ratio;
determining if the objects are a minimum size based on predetermined size criteria;
if the objects are larger than the minimum size, defining a scaling factor based on a performance level of the object; and
resizing the object based on the scaling factor such that delay variations of the resized circuit are substantially constant over time.

7. The method as recited in claim 6, wherein the step of defining the beta ratio includes the step of calculating the beta ratio by dividing a pullup width by a pulldown width for the CMOS objects.

8. The method as recited in claim 6, wherein the step of resizing the CMOS objects based on the beta ratio includes the step of reducing gate sizes of the objects thereby reducing capacitive loads and increasing circuit speed.

9. The method as recited in claim 6, wherein the step of defining the beta ratio includes the step of defining a default beta ratio for the circuit having CMOS objects.

10. The method as recited in claim 6, wherein the objects include one of gates, devices and circuits.

11. The method as recited in claim 6, wherein the step of determining if the objects are a minimum size based on predetermined size criteria include the step of determining if the objects are a minimum size based on the beta ratio.

12. The method as recited in claim 6, wherein the step of defining a scaling factor based on a performance level of the object includes the step of defining a scaling factor based on a current ratio, the current ratio being calculated as the ratio between a first current needed to drive a load, and a second current needed to drive the same load after an object to drive the load is resized.

13. A computer program product comprising:
a computer usable medium having computer readable program code embodied therein for sizing silicon-on-insulator CMOS circuits for reducing a hysteresis effect, the computer readable program code in the computer program product comprising:
computer readable program code for causing a computer to represent a circuit having CMOS objects, including program code for representing a bulk silicon CMOS circuit and for remapping the bulk silicon CMOS circuit to provide a silicon-on-insulator CMOS circuit;
computer readable program code for causing a computer to define a beta ratio so as to reduce the beta ratio while maintaining performance for the CMOS object above a threshold performance;

computer readable program code for causing a computer to resize the CMOS objects based on the beta ratio;

computer readable program code for causing a computer to determine if the objects are a minimum size based on predetermined size criteria;

computer readable program code for causing a computer to define a scaling factor based on a performance level of the object, if the objects are larger than the minimum size; and computer readable program code for causing a computer to resize the object based on the scaling factor such that delay variations of the resized circuit are substantially constant over time.

14. The computer program product as recited in claim 13, wherein the program code for causing the computer to define the beta ratio includes program code for calculating the beta ratio by dividing a pullup width by a pulldown width for the CMOS objects.

15. The computer program product as recited in claim 13, wherein the program code for causing the computer to resize the CMOS objects based on the beta ratio includes program code for reducing gate sizes of the objects thereby reducing capacitive loads and increasing circuit speed.

16. The computer program product as recited in claim 13, wherein the program code for causing the computer to define the beta ratio includes program code for defining a default beta ratio for the circuit having CMOS objects.

17. The computer program product as recited in claim 13, wherein the objects include one of gates, devices and circuits.

18. The computer program product as recited in claim 13, wherein the program code for causing the computer to determine if the objects are a minimum size based on predetermined size criteria includes program code for determining if the objects are a minimum size based on the beta ratio.

19. The computer program product as recited in claim 13, wherein the program code for causing the computer to define a scaling factor based on a performance level of the object includes program code for defining a scaling factor based on a current ratio, the current ratio being calculated as the ratio between a first current needed to drive a load, and a second current needed to drive the same load after an object to drive the load is resized.

* * * * *